United States Patent
Kuroki

(10) Patent No.: US 7,391,662 B2
(45) Date of Patent: Jun. 24, 2008

(54) SEMICONDUCTOR MEMORY DEVICE WITH REDUNDANCY CIRCUIT

(75) Inventor: Koji Kuroki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/785,961

(22) Filed: Apr. 23, 2007

(65) Prior Publication Data

US 2007/0195622 A1    Aug. 23, 2007

Related U.S. Application Data

(62) Division of application No. 11/001,026, filed on Dec. 2, 2004, now Pat. No. 7,254,070.

(30) Foreign Application Priority Data

Mar. 22, 2004    (JP)    ............................. 2004-082532

(51) Int. Cl.
*G11C 7/10* (2006.01)
*G11C 29/00* (2006.01)
*G11C 17/18* (2006.01)

(52) U.S. Cl. .................. 365/200; 365/189.08; 365/195; 365/201; 365/225.7

(58) Field of Classification Search ................. 365/200, 365/201, 225.7
See application file for complete search history.

(56) References Cited

U.S. PATENT DOCUMENTS

| | | | |
|---|---|---|---|
| 5,633,826 A * | 5/1997 | Tsukada | 365/200 |
| 6,118,710 A * | 9/2000 | Tsuji | 365/200 |
| 6,144,592 A * | 11/2000 | Kanda | 365/200 |
| 6,202,180 B1 | 3/2001 | Nose | |
| 6,208,570 B1 * | 3/2001 | Brown et al. | 365/201 |
| 6,252,809 B1 * | 6/2001 | Kim | 365/200 |
| 6,392,938 B1 * | 5/2002 | Choi et al. | 365/200 |
| 6,400,621 B2 * | 6/2002 | Hidaka et al. | 365/200 |
| 6,430,096 B1 * | 8/2002 | Grass | 365/201 |
| 6,462,994 B2 | 10/2002 | Kim | |
| 6,490,210 B2 | 12/2002 | Takase et al. | |
| 6,496,429 B2 | 12/2002 | Murai et al. | |
| 6,538,935 B1 | 3/2003 | Suzuki | |
| 2004/0205308 A1 | 10/2004 | Campenhausen et al. | |
| 2004/0205428 A1 | 10/2004 | Nanba et al. | |

FOREIGN PATENT DOCUMENTS

JP    07-220495    8/1995

* cited by examiner

*Primary Examiner*—Ly D Pham
(74) *Attorney, Agent, or Firm*—Studebaker & Brackett PC; Donald R. Studebaker

(57) ABSTRACT

A semiconductor device has a memory cell, decoders, a redundancy circuit and a mode setting circuit. The memory cell array has word lines including a redundant word line, bit lines and memory cells. A row decoder selects the word lines in response to a row address. Further, the row address decoder selects the redundant word line when a replacement signal is received. A column decoder selects the bit lines in response to a column address. A row address redundancy circuit stores a redundant row address. The row address redundancy circuit provides the replacement signal when the redundant row address corresponds to the received address. The mode setting circuit receives a mode signal having a normal mode and a test mode. The mode setting circuit outputs the replacement signal to the row decoder when the mode signal is in the normal mode, and prohibits an output of the replacement signal.

2 Claims, 2 Drawing Sheets

SEMICONDUCTOR MEMORY DEVICE WITH REDUNDANCY CIRCUIT

This application is Divisional of U.S. application Ser. No. 11/001,026 filed Dec. 2, 2004 now U.S. Pat. No. 7,254,070.

BACKGROUND OF THE INVENTION

The present invention relates to a semiconductor memory device with a redundancy circuit and a technique for reading redundant addresses in a semiconductor memory device equipped with redundant memory cells.

A semiconductor memory device is equipped with redundant memory cells each of which relieves a memory area of a defective or fail memory cell caused by a defect or the like in a process step in order to enhance yields. When a defect is found in an inspection step after package encapsulation and a malfunction has occurred on the customer's premises, there is also a need to examine the relationship between a defective address and its corresponding redundant memory cell upon its defective analysis. This is because only an inspection much looser than an inspection for a normal memory cell has been effected on the redundant memory cell in a pre-replacement probing process. That is, this is because a problem arises where a defect occurs in a redundant memory cell that should haven been replaced to relieve a defective memory cell.

The following two methods have heretofore been used as a method of examining a redundant address after package encapsulation. One of them is a method of making a package open and visually confirming a fuse cut off to set a redundant address. The other thereof is a method of incorporating a test circuit in advance and setting a test mode thereby to allow an output terminal to output information about cutting-off of a fuse.

However, the method of making the package open is accompanied by a problem that the package is broken. Also the method of allowing the output terminal to output the cut-off information of the fuse needed a signal path for reading the cut-off information of the fuse, i.e., a dedicated wiring extended from a fuse to a data bus. Therefore, a problem arose in that the area of a chip would increase because of the dedicated wiring.

SUMMARY OF THE INVENTION

It is an object of the present invention to provide a semiconductor memory device capable of reading information about cutting-off of a redundancy relieving fuse, i.e., a redundant address without increasing the area of a chip, and a method of reading a redundant address.

A semiconductor device of the present invention has a memory cell, decoders, a redundancy circuit and a mode setting circuit. The memory cell array has word lines including a redundant word line, bit lines and memory cells. A row decoder selects the word lines in response to a row address. Further, the row address decoder selects the redundant word line when a replacement signal is received. A column decoder selects the bit lines in response to a column address. A row address redundancy circuit stores a redundant row address. The row address redundancy circuit provides the replacement signal when the redundant row address corresponds to the received address. The mode setting circuit receives a mode signal having a normal mode and a test mode. The mode setting circuit outputs the replacement signal to the row decoder when the mode signal is in the normal mode, and prohibits an output of the replacement signal.

DETAILED DESCRIPTION OF THE PREFERRED EMBODIMENTS

A semiconductor memory device includes a memory cell block having a plurality of normal memory cells respectively selected in accordance with an input address and redundant memory cells as an alternative to defective memory cells in the normal memory cells, a fuse circuit which outputs a redundant address for relieving each of the defective memory cells in accordance with a cut-off state of a fuse, a fuse determination unit which outputs a replacement signal only when the input address coincides with the redundant address in a normal operation mode and does not output a replacement signal at other times, and an address decoder which selects the corresponding redundant memory cell in the memory cell block only when the replacement signal is given. In the semiconductor memory device, the normal operation mode is set to write predetermined data into all addresses. Next, a test operation mode is set to write inverted data of the predetermined data into all the addresses. Further, the normal operation mode is set to read the data at all the addresses, and the address at which the firstly written data of the read data is read out, is determined to be the corresponding redundant address.

The above and other objects and novel features of the present invention will become more completely apparent from the following description of preferred embodiments when the same is read with reference to the accompanying drawings. The drawings, however, are for the purpose of illustration only and by no means limitative of the invention.

FIRST PREFERRED EMBODIMENT

Figure 1:
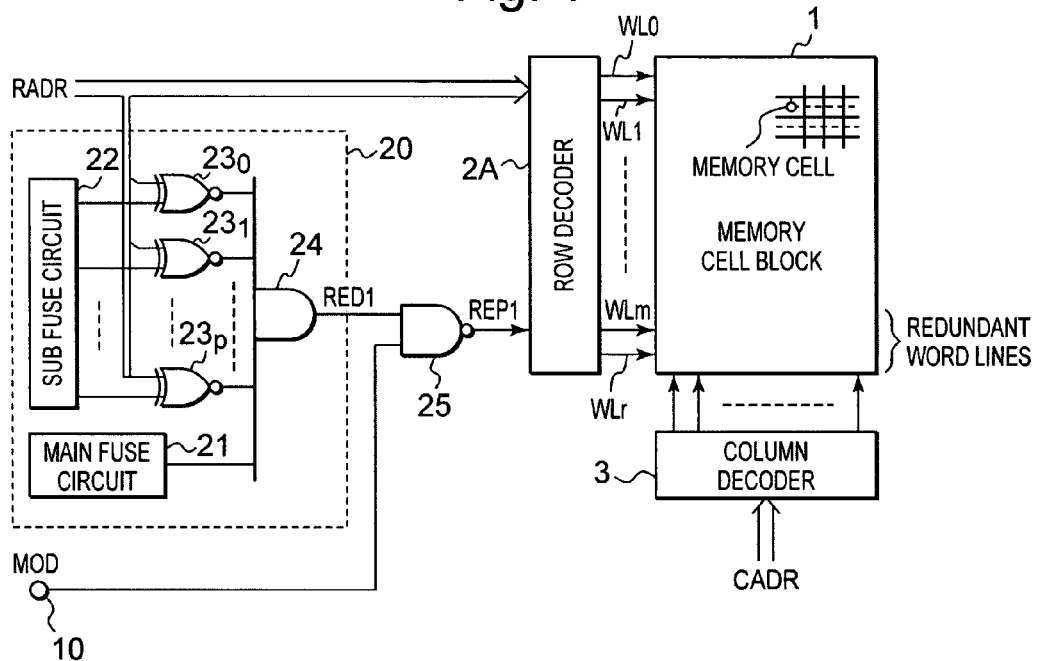
FIG. 1 is a schematic configurational diagram of a semiconductor memory device showing a first embodiment of the present invention.

FIG. 1 is a schematic configurational diagram of a semiconductor memory device showing a first embodiment of the present invention.

The semiconductor memory device includes a memory cell block 1 in which memory cells are arranged in matrix form at points where a plurality of word lines and a plurality of column lines intersect respectively, a row decoder 2A which drives each of the word lines in accordance with a row address signal RADR, and a column decoder 3 which selects each of the column lines in accordance with a column address signal CADR.

The row decoder 2A is supplied with a replacement signal REP1 for selecting a redundant memory cell in the memory cell block.1 in addition to the row address signal RADR. That is, when the replacement signal REP1 is of a level "H", the row decoder 2A decodes the row address signal RADR and thereby drives the corresponding word line WLi of the word lines WL0 through WLm. When the replacement signal REP1 is of a level "L", the row decoder 2A drives a spare or reserve word line WLr to which its corresponding redundant memory cell in the memory cell block 1 is connected, regardless of the row address signal RADR.

Further, the semiconductor memory device is provided with a terminal 10 inputted with a mode signal MOD for switching between a normal operation mode and a test operation mode, and a row fuse determination unit 20 which makes a decision as to whether the row address signal RADR coincides with a redundant address.

The row fuse determination unit 20 has a main fuse circuit 21 and a sub fuse circuit 22 for setting a defective address of a defective or fail memory cell as a redundant address where the defective memory cell exists. The main fuse circuit 21 outputs information about a main fuse cut off when the redundant address is set. When the fuse is cut off (i.e., redundant relief is being performed), the main fuse circuit 21 outputs "H", whereas when the fuse is not cut off (i.e., no redundant relief is being performed), the main fuse circuit 21 outputs "L". On the other hand, the sub fuse circuit 22 outputs information about redundant addresses set by selectively cutting off sub fuses of the same number as the number of bits of the row address signal RADR.

Signals outputted from the sub fuse circuit 22 are supplied to exclusive NOR gates (hereinafter called "ENORs") 23o through 23p together with the corresponding bits of the row address signal RADR. Further, signals outputted from the ENORs 23o through 23p are inputted to a multi-input AND gate (hereinafter called "AND") 24 together with the signal outputted from the main fuse circuit 21. Thus, when the row address signal RADR coincides with the redundant address, a redundancy signal RED1 of "H" is outputted from the AND 24. When they do not coincide with each other, a redundancy signal RED1 of "L" is outputted therefrom.

Further, the redundancy signal RED1 is supplied to one input of a two-input NAND gate (hereinafter called "NAND") 25. The mode signal MOD sent from the terminal 10 is supplied to the other input of the NAND 25. The replacement signal REP1 is outputted from the output of the NAND 25 and then supplied to the row decoder 2A.

Incidentally, if, for example, a buffer amplifier or the like wherein inverters large in drive capacity are connected in two stages, is inserted into the output side of the NAND 25 where the drive capacity of the NAND 25 falls short, then a reliable and high-speed operation is obtained.

The operation of the semiconductor memory device will next be explained.

A mode signal MOD is first set to "H" in the case of a normal operation. A row address signal RADR is inputted to the row decoder 2A and inputted to the row fuse determination unit 20. The row fuse determination unit 20 determines whether the row address signal RADR coincides with a redundant address.

If the row address signal RADR is found not to coincide with the redundant address, then a redundancy signal RED1 outputted from the row fuse determination unit 20 becomes "L", and a replacement signal REP1 outputted from the NAND 25 goes "H". Thus, the row decoder 2A decodes the row address signal RADR and thereby drives the corresponding word line WLi of the word lines WL0 through WLm.

When the row address signal RADR coincides with the redundant address, the redundancy signal REDI goes "H", and the replacement signal REP1 outputted from the NAND 25 goes "L". Thus, the row decoder 2A drives a spare word line WLr connected with a redundant memory cell regardless of the row address signal RADR.

A method of reading a row address subjected to redundant relief after execution of package encapsulation will next be explained.

When the mode signal MOD is set to "L" of a test operation mode, the replacement signal REP1 outputted from the NAND 25 goes "H" regardless of the level of the redundancy signal RED1 outputted from the row fuse determination unit 20. Therefore, the row decoder 2A decodes the row address signal RADR regardless of the presence or absence of the redundant relief and thereby drives the corresponding word line WLi of the word lines WL0 through WLm. Thus, if the following test is done, it is then possible to check on or examine a row address intended for the redundant relief.

That is, the mode signal MOD is first set to "H" of a normal operation mode, and predetermined data (e.g., "H") is written into all row addresses. Consequently, no data is written into a defective memory cell, and the data of "H" is written into a normal memory cell and a memory cell connected to the spare word line WLr for redundant relief.

Next, the mode signal MOD is set to the "L" of the test operation mode, and inverted data ("L" in this case) of the previously written data is written into all the row addresses again. Thus, the writing of the data into the memory cell connected to the spare word line WLr for redundant relief is not performed, so the data of "L" is written into the normal memory cell and the defective memory cell.

Then, the mode signal MOD is returned to the "H" of the normal operation mode and all the row addresses are read. Thus, the normal memory cell and the corresponding memory cell connected to the spare word line WLr for redundant relief are read. Since the data of "L" is overwritten into the normal memory cell at the second writing, the address from which the firstly written data (i.e., "H") is read, corresponds to the address of the. defective memory cell intended for redundant relief.

According to the first embodiment as described above, there is an advantage that since the row decoder 2A is configured so as to stop a redundancy relieving function when the test operation mode is set, a signal transmission path or the like for reading information about cutting off of a fuse becomes unnecessary, and information about a fuse for redundant relief can be obtained without increasing the area of a chip.

Incidentally, the circuit configurations of the row fuse determination unit 20 and the NAND 25 are not necessarily limited to the illustrated ones. That is, a circuit configuration may be adopted wherein only when the row address signal RADR coincides with the corresponding redundant address in the normal operation mode, the replacement signal REP1 for driving the spare word line WLr connected with the redundant memory cell is outputted to the row decoder 2A. For example, such a circuit configuration that the mode signal MOD is supplied to the input of the AND 24 and the NAND 25 is substituted with an inverter may be adopted.

SECOND PREFERRED EMBODIMENT

Figure 2:
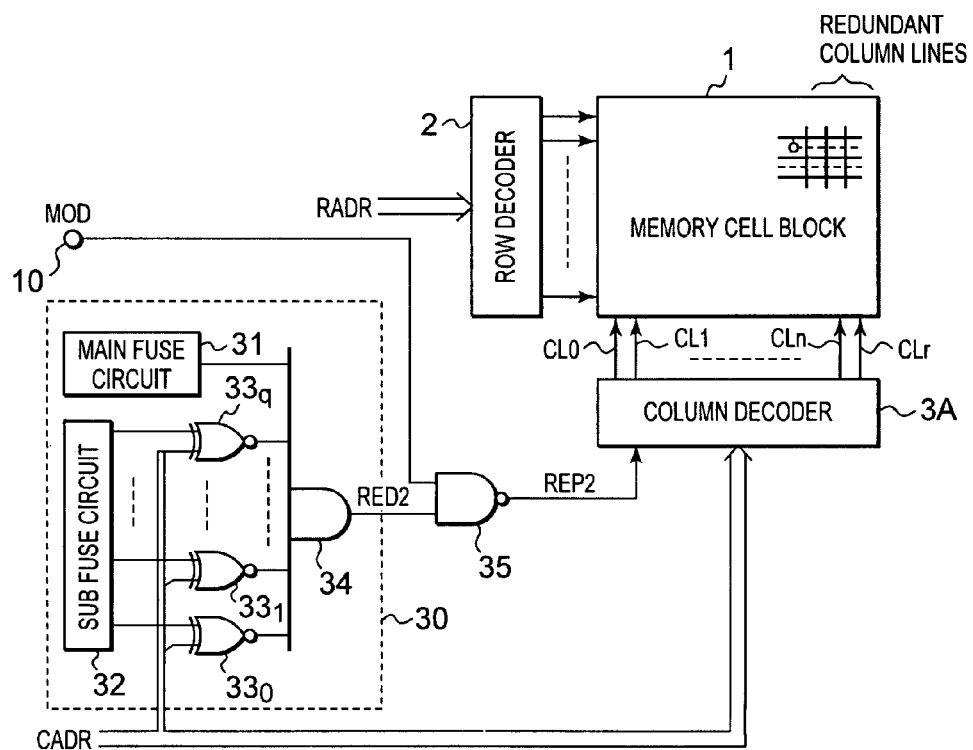
FIG. 2 is a schematic configurational diagram of a semiconductor memory device illustrating a second embodiment of the present invention.

FIG. 2 is a schematic configurational diagram of a semiconductor memory device showing a second embodiment of the present invention.

The semiconductor memory device is equipped with a memory cell block 1 in which memory cells are arranged in matrix form at points where a plurality of word lines and a plurality of column lines intersect respectively, a row decoder 2 which drives each of the word lines in accordance with a row address signal RADR, and a column decoder 3A which selects each of the column lines in accordance with a column address signal CADR.

The column decoder 3A is supplied with a replacement signal REP2 for selecting a redundant memory cell in the memory cell block 1 in addition to the column address signal CADR. That is, when the replacement signal REP2 is of "H", the column decoder 3A decodes the column address signal CADR to thereby select the corresponding column line CLj of the column lines CL0 through CLm. When the replacement signal REP2 is of "L", the column decoder 3A selects a spare or reserve column line CLr to which its corresponding redundant memory cell in the memory cell block 1 is connected, regardless of the column address signal CADR.

Further, the semiconductor memory device is provided with a terminal 10 inputted with a mode signal MOD for switching between a normal operation mode and a test operation mode, and a column fuse determination unit 30 which makes a decision as to whether the column address signal CADR coincides with a redundant address.

The column fuse determination unit 30 has a main fuse circuit 31 and a sub fuse circuit 32 for setting a defective address of a defective or fail memory cell as a redundant address where the defective memory cell exists. The main fuse circuit 31 outputs information about a main fuse cut off when the redundant address is set. When the fuse is cut off, the main fuse circuit 31 outputs "H", whereas when the fuse is not cut off, the main fuse circuit 31 outputs "L". On the other hand, the sub fuse circuit 32 outputs information about redundant addresses set by selectively cutting off sub fuses of the same number as the number of bits of the column address signal CADR.

Signals outputted from the sub fuse circuit 32 are supplied to ENORs 33o through 33q together with the corresponding bits of the column address signal CADR. Further, signals outputted from the ENORs 33o through 33q are inputted to a multi-input AND 34 together with the signal outputted from the main fuse circuit 31. Thus, when the column address signal CADR coincides with the redundant address, a redundancy signal RED2 of "H" is outputted form the AND 34. When they do not coincide with each other, a redundancy signal RED2 of "L" is outputted therefrom.

Further, the redundancy signal RED2 is supplied to one input of a two-input NAND 35. The mode signal MOD sent from the terminal 10 is supplied to the other input of the NAND 35. A replacement signal REP2 is outputted from the output of the NAND 35 and then supplied to the column decoder 3A. Incidentally, if, for example, a buffer amplifier or the like wherein inverters large in drive capacity are connected in two stages, is inserted into the output side of the NAND 35 where the drive capacity of the NAND 35 falls short, then a reliable and high-speed operation is obtained.

The operation and advantage of the semiconductor memory device showing the second embodiment are exactly the same as those of the semiconductor memory device of FIG. 1 described in the first embodiment if "the row address" is read as "the column address".

THIRD PREFERRED EMBODIMENT

Figure 3:
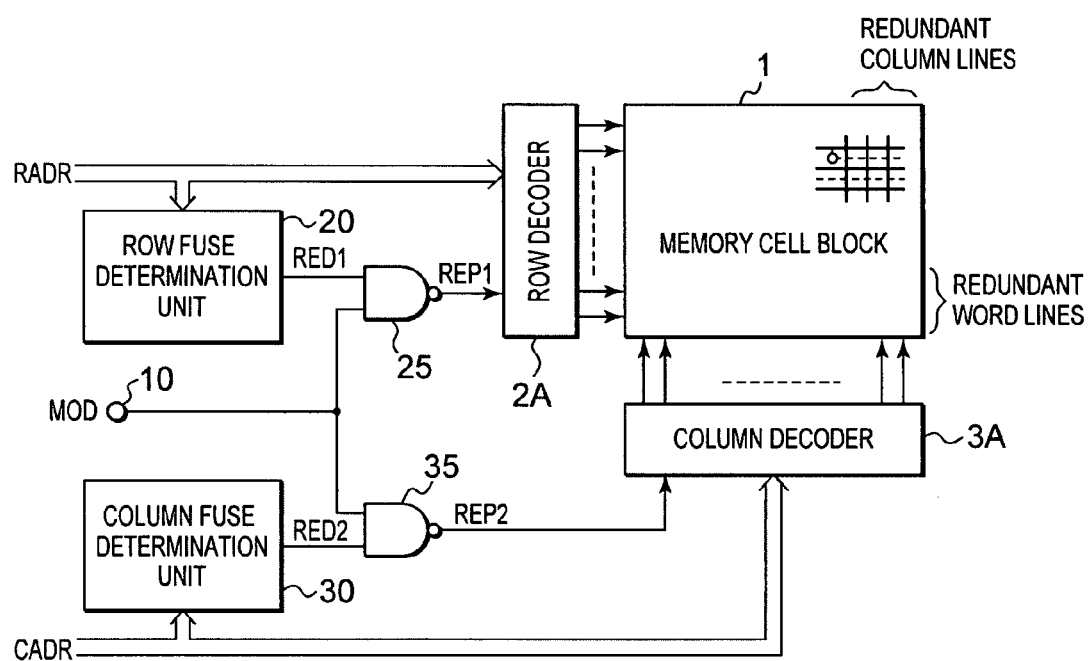
FIG. 3 is a schematic configurational diagram of a semiconductor memory device depicting a third embodiment of the present invention.

FIG. 3 is a schematic configurational diagram of a semiconductor memory device showing a third embodiment of the present invention. Elements common to those shown in FIGS. 1 and 2 are given common reference numerals.

The present semiconductor memory device comprises a combination of the semiconductor memory devices shown in FIGS. 1 and 2. The semiconductor memory device includes a memory cell block 1 similar to FIG. 1, a row decoder 2A, a terminal 10, a row fuse determination unit 20 and a NAND 25, and a column decoder 3A, a column fuse determination unit 30 and a NAND 35 similar to FIG. 2.

The operation of the present semiconductor memory device corresponds to a combination of the operations of the semiconductor memory devices shown in FIGS. 1 and 2. That is, if a redundant address is specified by a row address signal RADR when a normal operation mode is being set by a mode signal MOD supplied to the terminal 10, then a spare word line WLr to which a redundant memory cell is connected, is driven by the row decoder 2A. If a redundant address is specified by a column address signal CADR, then a spare column line CLr to which a redundant memory cell is connected, is driven by the column decoder 3A. A method of reading a row address or the like subjected to redundant relief is as explained in the first embodiment.

According to the third embodiment as described above, there is an advantage that since the row decoder 2A and the column decoder 3A are configured so as to stop a redundancy relieving function when the test operation mode is set, a signal transmission path or the like for reading information about cutting off of a fuse becomes unnecessary and information about a fuse for redundant relief can be obtained without increasing the area of a chip.

The present invention includes a fuse determination unit which outputs a replacement signal only when an input address coincides with a redundant address in a normal operation mode and does not output it at all other times, and an address decoder which selects a corresponding redundant memory cell in a memory cell block only when the replacement signal is given. Thus, there is an advantage that since another data is written onto data written in the normal operation mode in a test operation mode, and the redundant address can be determined by reading such another data, the redundant address can be read without increasing the area of a chip.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
    a memory cell array having a plurality of word lines,
    a plurality of bit lines and a plurality of memory cells each of which is located at an intersection between one of the word lines and one of the bit lines, wherein the bit lines includes a redundant bit line;
    a row decoder connected to the word lines, the row decoder selecting one of the word lines in response to a row address;
    a column decoder connected to the bit lines, the column decoder selecting one of the bit lines in response to a column address, the column address decoder selecting the redundant bit line when a second replacement signal is received thereto;
    a column address redundancy circuit storing a redundant column address, the column address redundancy circuit providing a replacement signal when the redundant column address corresponds to an address received thereto; and
    a mode setting circuit connected to the column address redundancy circuit and the column decoder for receiving a mode signal having a normal mode and a test mode, the mode setting circuit outputting the replacement signal received from the column address redundancy circuit to the column decoder when the mode signal is in the normal mode, and prohibiting the replacement signal received from the column address redundancy circuit to be outputted to the column decoder when the mode signal is in the test mode, wherein the fuse circuit includes:
        a main fuse circuit having a first fuse for indicating whether the redundant bit line is used, and a sub fuse circuit having a plurality of second fuses for storing the redundant column address.

2. A semiconductor device comprising:

a memory cell array having a plurality of word lines, a plurality of bit lines and a plurality of memory cells each of which is located at an intersection between one of the word lines and one of the bit lines, wherein the bit lines includes a redundant bit line;

a row decoder connected to the word lines, the row decoder selecting one of the word lines in response to a row address;

a column decoder connected to the bit lines, the column decoder selecting one of the bit lines in response to a column address, the column address decoder selecting the redundant bit line when a second replacement signal is received thereto;

a column address redundancy circuit storing a redundant column address, the column address redundancy circuit providing a replacement signal when the redundant column address corresponds to an address received thereto; and a mode setting circuit connected to the column address redundancy circuit and the column decoder for receiving a mode signal having a normal mode and a test mode, the mode setting circuit outputting the replacement signal received from the column address redundancy circuit to the column decoder when the mode signal is in the normal mode, and prohibiting the replacement signal received from the column address redundancy circuit to be outputted to the column decoder when the mode signal is in the test mode, wherein the mode setting circuit is a gate circuit having a first input terminal connected to receive the mode signal, a second input terminal connected to the column address redundancy circuit and an output terminal connected to the column decoder, wherein the mode setting circuit is a NAND circuit.

* * * * *